United States Patent
Choi

(10) Patent No.: US 10,249,236 B2
(45) Date of Patent: Apr. 2, 2019

(54) ORGANIC LIGHT-EMITTING DISPLAY APPARATUS INCLUDING AN AUXILIARY GATE ELECTRODE

(71) Applicant: SAMSUNG DISPLAY CO., LTD., Yongin-si, Gyeonggi-do (KR)

(72) Inventor: Sunghwan Choi, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 75 days.

(21) Appl. No.: 15/097,440

(22) Filed: Apr. 13, 2016

(65) Prior Publication Data
US 2017/0110049 A1   Apr. 20, 2017

(30) Foreign Application Priority Data
Oct. 19, 2015   (KR) .................. 10-2015-0145428

(51) Int. Cl.
G09G 3/3208    (2016.01)
G09G 3/20      (2006.01)
H01L 27/32     (2006.01)

(52) U.S. Cl.
CPC ........ *G09G 3/3208* (2013.01); *G09G 3/2092* (2013.01); *H01L 27/3262* (2013.01); *H01L 27/3265* (2013.01); *G09G 2320/043* (2013.01)

(58) Field of Classification Search
CPC ........... G09G 2320/043; G09G 3/2092; G09G 3/3208
See application file for complete search history.

(56) References Cited

U.S. PATENT DOCUMENTS

| 5,208,476 A | 5/1993 | Inoue |
| 2002/0034842 A1 | 3/2002 | Joo et al. |
| 2003/0122196 A1* | 7/2003 | Hwang ............ H01L 29/42384 257/359 |
| 2004/0252565 A1* | 12/2004 | Yamazaki ........... G09G 3/3233 365/202 |
| 2008/0044963 A1* | 2/2008 | Cho ........................ C22C 9/00 438/160 |
| 2014/0168194 A1* | 6/2014 | Kong .................. G09G 3/3233 345/212 |

(Continued)

FOREIGN PATENT DOCUMENTS

| KR | 10-2002-0021546 | 3/2002 |
| KR | 10-2003-0057074 | 7/2003 |
| KR | 10-2014-0141333 | 12/2014 |

OTHER PUBLICATIONS

Chien, et al., "A Novel Self-Aligned Double-Channel Polysilicon Thin-Film Transistor", IEEE Transactions on Electronic Devices, vol. 60, No. 2, Feb. 2013, pp. 799-804.

*Primary Examiner* — Chun-Nan Lin
(74) *Attorney, Agent, or Firm* — F. Chau & Associates, LLC

(57) ABSTRACT

An organic light-emitting display apparatus includes a substrate and an active layer disposed on the substrate. The active layer includes a source region, a drain region, and a channel region disposed between the source region and the drain region. A gate electrode overlaps the channel region. An auxiliary gate electrode is disposed between the gate electrode and the channel region. A first voltage is applied to the auxiliary gate electrode. A first thin-film transistor includes the active layer, the auxiliary gate electrode, and the gate electrode.

11 Claims, 11 Drawing Sheets

(56) References Cited

U.S. PATENT DOCUMENTS

2014/0353605 A1 12/2014 Kim et al.
2015/0116191 A1* 4/2015 Qi .................. G09G 3/3233
                                                                  345/76

\* cited by examiner

ORGANIC LIGHT-EMITTING DISPLAY APPARATUS INCLUDING AN AUXILIARY GATE ELECTRODE

CROSS-REFERENCE TO RELATED APPLICATION

This application claims priority under 35 U.S.C. § 119 to Korean Patent Application No. 10-2015-0145428, filed on Oct. 19, 2015, in the Korean Intellectual Property Office, the disclosure of which is incorporated by reference herein in its entirety.

TECHNICAL FIELD

Exemplary embodiments of the present invention relate to a display apparatus, and more particularly to an organic light-emitting display apparatus.

DISCUSSION OF RELATED ART

An organic light-emitting display apparatus may include two electrodes and an emission layer disposed between the two electrodes. An electrode injected from one electrode and a hole injected from the other electrode may combine in the emission layer and generate an exciton. Light may be emitted when the exciton emits energy. The organic light-emitting display apparatus may include a plurality of pixels that each include an organic light-emitting diode. Each of the organic light-emitting diodes may be a self-emissive device. Each of the pixels may include a plurality of thin-film transistors and at least one capacitor driving the organic light-emitting diode. The thin-film transistors may each include a switching transistor and a driving transistor.

When a leakage current exists in the switching transistor, an organic light-emitting diode that is supposed to display a black color may emit a relatively small amount of light.

SUMMARY

One or more exemplary embodiments of the present invention may include an organic light-emitting display apparatus including a thin-film transistor in which a leakage current is reduced or eliminated, and in which a deterioration of the thin-film transistor is reduced or eliminated.

According to one or more exemplary embodiments of the present invention, an organic light-emitting display apparatus includes a substrate and an active layer disposed on the substrate. The active layer includes a source region, a drain region, and a channel region disposed between the source region and the drain region. A gate electrode overlaps the channel region. An auxiliary gate electrode is disposed between the gate electrode and the channel region. A first voltage is applied to the auxiliary gate electrode. A first thin-film transistor includes the active layer, the auxiliary gate electrode, and the gate electrode.

The channel region may include a first portion overlapping the auxiliary gate electrode, and a second portion not overlapping the auxiliary gate electrode. The first portion may be adjacent to the drain region, and the second portion may be adjacent to the source region.

An area of the first portion may be from about 10% to about 50% of an area of the channel region.

The first thin-film transistor may include a p-type transistor, and the first voltage may have a negative direct current voltage level.

The first voltage may have a voltage level from about −6 V to about 0 V.

The organic light-emitting display apparatus may include a first gate insulating layer disposed between the active layer and the auxiliary gate electrode. The first gate insulating layer may insulate the active layer from the auxiliary gate electrode. A second gate insulating layer may be disposed between the auxiliary gate electrode and the gate electrode. The second gate insulating layer may insulate the auxiliary gate electrode from the gate electrode.

The gate electrode may be disposed on the active layer.

The gate electrode may be disposed between the substrate and the active layer.

The gate electrode may include a first gate electrode disposed on the active layer overlapping the channel region. A second gate electrode may be disposed between the substrate and the active layer overlapping the channel region.

The auxiliary gate electrode may be disposed between one of the first and second gate electrodes and the channel region.

The auxiliary gate electrode may include a first auxiliary gate electrode disposed between the first gate electrode and the channel region, and a second auxiliary gate electrode disposed between the second gate electrode and the channel region.

The auxiliary gate electrode may overlap a portion of the channel region and a portion of the drain region.

The organic light-emitting display apparatus may include a plurality of pixels. Each of the plurality of pixels may include a first switching transistor providing a data signal voltage in response to a scan signal. Each of the plurality of pixels may include a driving transistor generating a driving current according to the data signal voltage provided by the first switching transistor. Each of the plurality of pixels may include a capacitor storing the data signal voltage provided to the driving transistor.

The first thin-film transistor may include the driving transistor.

The first thin-film transistor may be configured to compensate for a threshold voltage difference of the driving transistor in response to the scan signal.

The first thin-film transistor may provide an initialization voltage to a gate of the driving transistor in response to an initialization control signal.

The first voltage may correspond to the initialization voltage.

Each of the plurality of pixels may include an emission device. A fourth switching transistor may provide a first driving voltage to the driving transistor in response to an emission control signal. A fifth switching thin-film transistor may provide the driving current to the emission device in response to an emission control signal.

The organic light-emitting display apparatus may include a plurality of pixels. Each of the plurality of pixels may include the first thin-film transistor including the gate electrode to which a scan signal is applied. A second thin-film transistor may include a gate to which the scan signal is applied, and a source to which a data signal voltage is applied. A third thin-film transistor may include a gate connected to a source region of the first thin-film transistor. A drain may be connected to a drain region of the first thin-film transistor, and a source may be connected to a drain of the second thin-film transistor.

The organic light-emitting display apparatus may include a fourth thin-film transistor including a gate to which an initialization control signal is applied, a drain to which the first voltage is applied, and a source connected to the gate of the third thin-film transistor.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION

Figure 1:
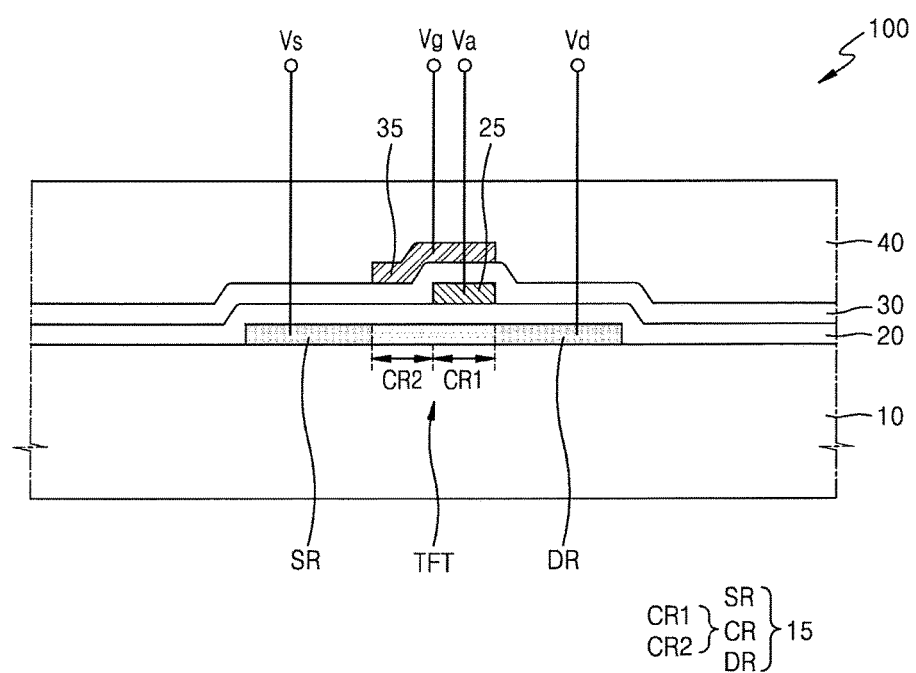
FIG. 1 illustrates a cross-sectional view of a thin-film transistor substrate, according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

It will be understood that when an element or layer is referred to as being "on" another element or layer, the element or layer may be directly on another element or layer or intervening elements or layers may be present.

Spatially relative terms, such as "below," "beneath," "lower," "above" and "upper" may be used herein for clarity of description to describe the relationship of one element or feature to another element(s) or feature(s) as illustrated in the figures. It will be understood that the spatially relative terms may encompass different orientations of the device in use or operation, in addition to the orientation depicted in the figures.

While such terms as "first" and "second" may be used to describe various components, such components are not to be limited to these terms.

One or more exemplary embodiments of the present invention may be described herein with reference to cross-section illustrations that are schematic illustrations, which may include intermediate structures. Variations from the shapes of the illustrations as a result, for example, of manufacturing techniques and/or tolerances, may occur. Thus, the one or more embodiments of the present invention should not be construed as limited to the particular shapes of regions illustrated herein but are to include deviations in shapes that result, for example, from manufacturing.

In the specification and drawings, like reference numerals may refer to like elements.

FIG. 1 illustrates a cross-sectional view of a thin-film transistor substrate, according to an exemplary embodiment of the present invention.

Referring to FIG. 1, a thin-film transistor substrate 100 may include a substrate 10, an active layer 15, an auxiliary gate electrode 25, and a gate electrode 35. The active layer 15, the auxiliary gate electrode 25, and the gate electrode 35 may form a top-gate type thin-film transistor.

The active layer 15 may be disposed on the substrate 10. The active layer 15 may include a source region SR, a channel region CR, and a drain region DR. The gate electrode 35 may overlap the channel region CR. The auxiliary gate electrode 25 may be disposed between the gate electrode 35 and the channel region CR. A first voltage Va may be applied to the auxiliary gate electrode 25.

The substrate 10 may support substantially the entire thin-film transistor substrate 100 and may maintain the thin-film transistor substrate 100 in a relatively rigid state. The substrate 10 may have a planar top surface and may include a transparent insulating material. For example, the substrate 10 may include a glass material. However, exemplary embodiments of the present invention are not limited thereto, and the substrate 10 may include a plastic material including polyethersulphone (PES), or polyacrylate (PAR). For example, the substrate 10 may include an opaque material including metal, or carbon fiber. The substrate 10 may include a flexible plastic material including a polyimide (PI) film. The substrate 10 may be included in a flexible display apparatus. For example, the substrate 10 including the flexible plastic material including the polyimide (PI) film may be included in the flexible display apparatus.

A buffer layer may be disposed on the substrate 10. The buffer layer may provide a planar surface on the substrate 10 and may reduce or prevent penetration of foreign substances. The buffer layer may be formed, by using one of various deposition methods, as a single layer or multiple layers including an inorganic material including silicon oxide (SiOx) and/or silicon nitride (SiNx).

The active layer 15 may be disposed on the substrate 10. The active layer 15 may include a semiconductor material such as amorphous silicon or polycrystalline silicon. However, exemplary embodiments of the present invention are not limited thereto, and the active layer 15 may include an oxide semiconductor material such as $GIZO[(In_2O_3)_a(Ga_2O_3)_b(ZnO)_c]$ (where, a, b, c are real numbers that satisfy $a \geq 0$, $b \geq 0$, $c > 0$, respectively). The active layer 15 may include, in addition to GIZO, oxide of at least one material of Groups 12, 13, and 14 elements including zinc (Zn), indium (In), gallium (Ga), tin (Sn), cadmium (Cd), germanium (Ge), and hafnium (Hf), and a combination thereof.

The active layer 15 may include the source region SR, the drain region DR, and the channel region CR between the source region SR and the drain region DR. A voltage of the source region SR may be referred to as a source voltage Vs, and a voltage of the drain region DR may be referred to as a drain voltage Vd.

When the active layer 15 includes amorphous silicon or polycrystalline silicon, the source region SR and the drain region DR may be doped with an impurity. The impurity may be injected using the auxiliary gate electrode 25 and the gate electrode 35 as masks. For example, when a thin-film transistor TFT is a p-type thin-film transistor, the source region SR and the drain region DR may include a p-type impurity such as boron, or aluminum. When the thin-film transistor TFT is an n-type thin-film transistor, the source region SR and the drain region DR may include an n-type impurity such as phosphorus, or arsenic. According to another exemplary embodiment of the present invention, when the active layer 15 includes an oxide semiconductor material, a process in which the source region SR and the drain region DR are doped with the impurity may be omitted. Throughout the specification, the thin-film transistor TFT may be a p-type thin-film transistor. However, exemplary embodiments of the present invention are not limited thereto.

The auxiliary gate electrode 25 may be disposed between a portion of the channel region CR and the gate electrode 35. The first voltage Va may be applied to the auxiliary gate electrode 25, and the auxiliary gate electrode 25 may apply an electric field to the portion of the channel region CR, according to the first voltage Va. The auxiliary gate electrode 25 may include a relatively low resistance metal material. For example, the auxiliary gate electrode 25 may include a single layer or multiple layers including a conductive material including molybdenum (Mo), aluminum (Al), copper (Cu), or titanium (Ti).

The channel region CR may include a first portion CR1 overlapping with the auxiliary gate electrode 25, and a second portion CR2 not overlapping with the auxiliary gate electrode 25. An area of the channel region CR may be determined by multiplying a channel length between the source region SR and the drain region DR by a channel width in a perpendicular direction with respect to the channel length. The first portion CR1 and the second portion CR2 may have substantially identical channel widths. The first portion CR1 may be adjacent to the drain region DR, and the second portion CR2 may be adjacent to the source region SR. That is, the auxiliary gate electrode 25 may be disposed on the first portion CR1 of the channel region CR, which may be adjacent to the drain region DR. An area of the first portion CR1 may be from about 10% to about 50% of the area of the channel region CR. For example, the area of the first portion CR1 may be from about 20% to about 40% of the area of the channel region CR. According to exemplary embodiments of the present invention, when a channel length of the channel region CR is 2.75 µm, and lengths of the first portion CR1 are 0.4 µm, 0.6 µm, and 0.8 µm, the drain voltage Vd may be −5.1 V, and even when a gate voltage Vg is increased, a leakage current might not be increased. When a voltage of −3.5 V is applied to the auxiliary gate electrode 25 and the length of the first portion CR1 is 0.1 µm or 0.2 µm, a problem may occur in which a generated leakage current is similar to that without the auxiliary gate electrode 25, and when the length of the first portion CR1 is 1.5 µm, a threshold voltage of the thin-film transistor TFT may be decreased and a turn-on current may be decreased. When the length of the first portion CR1 is 2.2 µm, the thin-film transistor TFT might not be usable as a switching device.

When the thin-film transistor TFT is a p-type thin-film transistor, the first voltage Va applied to the auxiliary gate electrode 25 may have a negative direct current voltage level. For example, the first voltage Va may have a voltage level from about −6 V to about 0 V. For example, the first voltage Va may be −3.5 V.

The gate electrode 35 may overlap the channel region CR and thus may define the channel region CR. The gate voltage Vg may apply an ON or OFF signal to the thin-film transistor TFT, and the gate voltage Vg may be applied to the gate electrode 35. The gate electrode 35 may include a relatively low resistance metal material. For example, the gate electrode 35 may include a single layer or multiple layers including a conductive material including molybdenum (Mo), aluminum (Al), copper (Cu), or titanium (Ti). When the thin-film transistor TFT is a p-type thin-film transistor, the gate voltage Vg may be a low-level turn-on voltage or a high-level turn-off voltage. The turn-on voltage may have a voltage level equal to or less than about −3 V (e.g., a voltage level of −10 V). The turn-off voltage may have a voltage level equal to or greater than about 3 V (e.g., a voltage level of 10 V). According to an exemplary embodiment of the present invention the turn-off voltage may have a voltage level of 20 V.

A first gate insulating layer 20 may be disposed between the active layer 15 and the auxiliary gate electrode 25 and may insulate the active layer 15 from the auxiliary gate electrode 25. The first gate insulating layer 20 may include a single layer or multiple layers including an inorganic material including silicon oxide (SiOx) and/or silicon nitride (SiNx).

A second gate insulating layer 30 may be disposed between the auxiliary gate electrode 25 and the gate electrode 35 and may insulate the auxiliary gate electrode 25 from the gate electrode 35. The second gate insulating layer 30 may include a single layer or multiple layers including an inorganic material including silicon oxide (SiOx) and/or silicon nitride (SiNx). The second gate insulating layer 30 may include a same material as the first gate insulating layer 20.

An interlayer insulating layer 40 may be disposed on the second gate insulating layer 30 and the gate electrode 35. The interlayer insulating layer 40 may include a single layer or multiple layers including an inorganic material. For example, the inorganic material may include a metal oxide material or a metal nitride material. The inorganic material may include silicon nitride ($SiO_2$), silicon nitride (SiNx), silicon oxynitride (SiON), aluminum oxide ($Al_2O_3$), titanium oxide ($TiO_2$), tantalum pentoxide ($Ta_2O_5$), hafnium oxide ($HfO_2$), or zirconium oxide ($ZrO_2$). Source and drain electrodes may be disposed on the interlayer insulating layer 40, and the interlayer insulating layer 40 may insulate the gate electrode 35 from the source and drain electrodes.

The auxiliary gate electrode 25 may be disposed over the first portion CR1 of the channel region CR in a top-gate type thin-film transistor. To turn off a thin-film transistor when a high-level gate voltage Vg of about at least 10 V is applied to the gate electrode 35, electrons may gather on a top surface of the channel region CR. When a drain voltage Vd has a low level of about −5 V, a large electric field may be induced in a boundary between the channel region CR and the drain region DR. The electrons that gather on the top surface of the channel region CR move toward the source region SR due to the electric field induced in the boundary by the drain voltage Vd, and a leakage current that flows from the source region SR to the drain region DR may be generated.

However, according to an exemplary embodiment of the present invention, the first voltage Va having a negative voltage level may be applied to the auxiliary gate electrode 25 disposed on a portion of the channel region CR (e.g., on the first portion CR1 adjacent to the drain region DR). Thus, a negative electric field may be applied to a top surface of the first portion CR1, and a large electric field due to the drain voltage Vd might not be applied to the top surface of the first portion CR1. Thus, electrons gathered on the channel region CR (e.g., on a top surface of the second portion CR2), might not move toward the source region SR. Thus, even if the gate voltage Vg is further increased or the drain voltage Vd is further decreased, a leakage current might not be generated.

Figure 2:
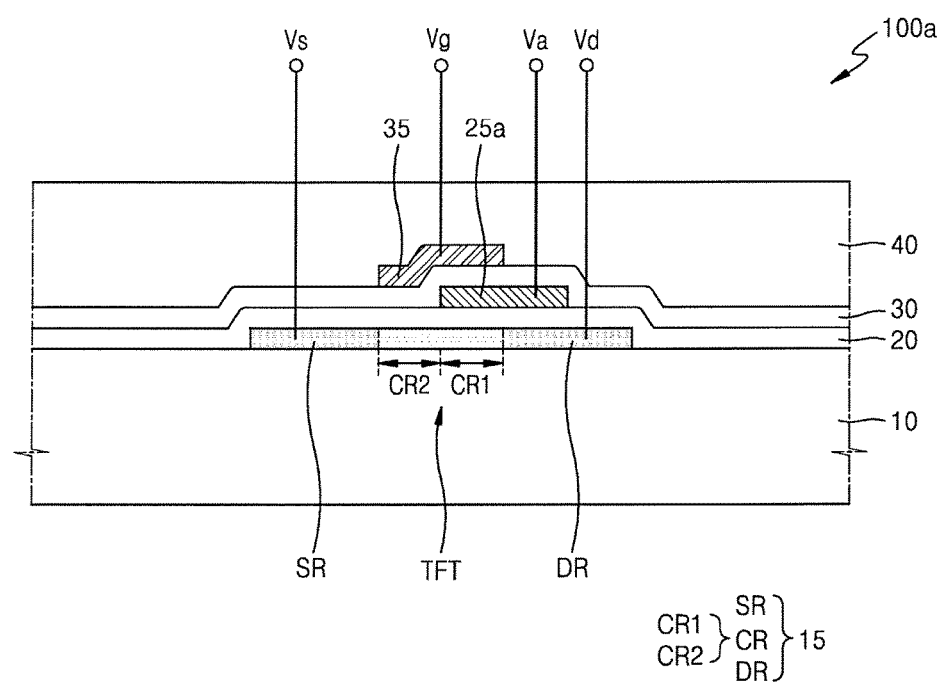
FIG. 2 illustrates a cross-sectional view of a thin-film transistor substrate, according to an exemplary embodiment of the present invention.

FIG. 2 illustrates a cross-sectional view of a thin-film transistor substrate, according to an exemplary embodiment of the present invention.

Referring to FIG. 2, a thin-film transistor substrate 100a includes the substrate 10, the active layer 15, an auxiliary gate electrode 25a, and the gate electrode 35. The active layer 15, the auxiliary gate electrode 25a, and the gate electrode 35 may form a top-gate type thin-film transistor.

The active layer 15 may be disposed on the substrate 10, and may include a source region SR, a channel region CR, and a drain region DR. The gate electrode 35 may overlap the channel region CR. The auxiliary gate electrode 25a may be disposed between the gate electrode 35 and the channel region CR. The first voltage Va may be applied to the auxiliary gate electrode 25. The auxiliary gate electrode 25a may extend toward the drain region DR and may overlap with a portion (e.g., the first portion CR1) of the channel region CR and a portion of the drain region DR.

The substrate 10, the active layer 15, and the gate electrode 35 may be substantially the same as the substrate 10, the active layer 15, and the gate electrode 35 of the thin-film transistor substrate 100, and duplicative descriptions may be omitted.

The active layer 15 may include a silicon semiconductor material or an oxide semiconductor material. When the active layer 15 includes the silicon semiconductor material, a process of injecting an impurity into the source region SR and the drain region DR may be performed by using a separate mask, before the auxiliary gate electrode 25a is formed. When the active layer 15 includes the oxide semiconductor material, an impurity doping process may be omitted. Thus, in the thin-film transistor substrate 100a according to an exemplary embodiment of the present invention, the active layer 15 may include the oxide semiconductor material.

The auxiliary gate electrode 25a may be disposed on the first gate insulating layer 20 and may cover a portion of the drain region DR in addition to the first portion CR1 of the channel region CR. A width of the auxiliary gate electrode 25a may be substantially equal to a width of the gate electrode 35. The auxiliary gate electrode 25a may be disposed on the first portion CR1 of the channel region CR and on a portion of the drain region DR.

The thin-film transistor of FIG. 1 and the thin-film transistor of FIG. 2 may have electrical characteristics that are substantially the same as each other. When the drain region DR is conductive, an electric field of the first voltage Va applied to the auxiliary gate electrode 25a might not affect the drain region DR. Thus, to turn off the thin-film transistor, a high-level gate voltage Vg of about at least 10 V may be applied to the gate electrode 35, and electrons may gather on a top surface of the channel region CR. However, when the first voltage Va having a negative voltage level is applied to the auxiliary gate electrode 25a, a negative electric field may be induced in a boundary between the channel region CR and the drain region DR, and a large electric field might not be induced in the boundary between the channel region CR and the drain region DR. Thus, electrons gathered on the top surface of the channel region CR might not move toward the source region SR. Thus, even if the gate voltage Vg is increased or a drain voltage Vd is decreased, a leakage current might not be generated.

Figure 3:
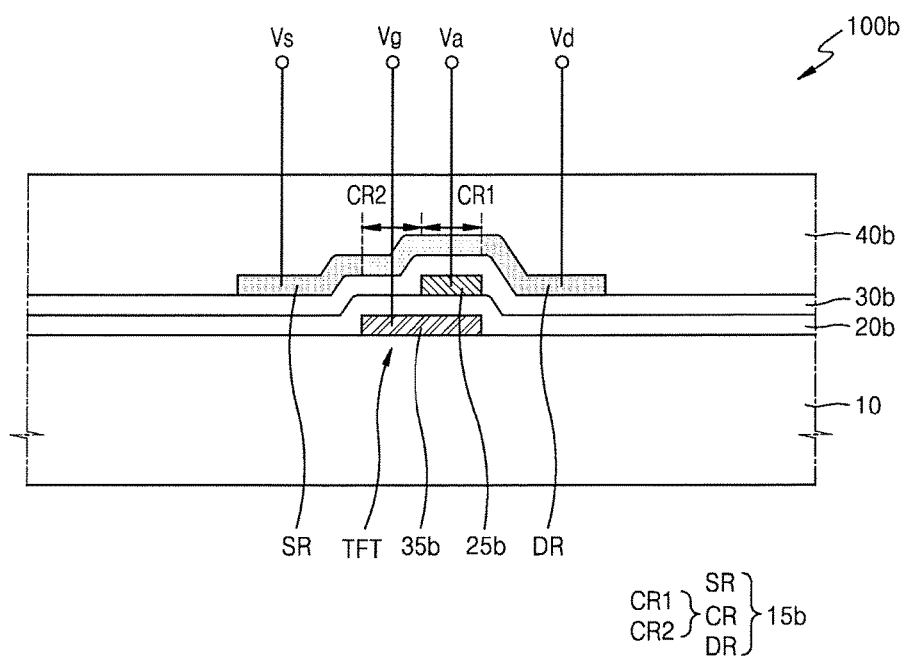
FIG. 3 illustrates a cross-sectional view of a thin-film transistor substrate, according to an exemplary embodiment of the present invention.

FIG. 3 illustrates a cross-sectional view of a thin-film transistor substrate, according to an exemplary embodiment of the present invention.

Referring to FIG. 3, a thin-film transistor substrate 100b may include the substrate 10, a gate electrode 35b, an auxiliary gate electrode 25b, and an active layer 15b. The gate electrode 35b, the auxiliary gate electrode 25b, and the active layer 15b may form a bottom-gate type thin-film transistor.

The gate electrode 35b may be disposed on the substrate 10. The active layer 15b may be disposed on the gate electrode 35b, and may include the source region SR, the channel region CR, and the drain region DR. The channel region CR may overlap the gate electrode 35b. The auxiliary gate electrode 25b may be disposed between the gate electrode 35b and the channel region CR. The first voltage Va may be applied to the auxiliary gate electrode 25b.

The first portion CR1 of the channel region CR, which may be adjacent to the drain region DR, may overlap the auxiliary gate electrode 25b.

The substrate 10 may support substantially the entire thin-film transistor substrate 100b and may maintain the thin-film transistor substrate 100b in a relatively rigid state. The substrate 10 may have a planar top surface and may include a glass substrate or a plastic substrate. A buffer layer may be disposed on the substrate 10, which may provide a planar surface on the substrate 10 and may reduce or prevent penetration of foreign substances. The buffer layer may include an inorganic material such as silicon oxide (SiOx) and/or silicon nitride (SiNx).

The gate electrode 35b may be disposed on the substrate 10. The gate electrode 35b may include a relatively low resistance metal material. For example, the gate electrode 35b may include a single layer or multiple layers including a conductive material including molybdenum (Mo), aluminum (Al), copper (Cu), or titanium (Ti). The gate voltage Vg may apply an ON or OFF signal to the thin-film transistor TFT. The ON or OFF voltage may be applied to the gate electrode 35b. When the thin-film transistor TFT is a p-type thin-film transistor, the gate voltage Vg may be a low-level turn-on voltage or a high-level turn-off voltage. The turn-on voltage may have a voltage level equal to or less than about −3 V (e.g., a voltage level of −10 V). The turn-off voltage may have a voltage level equal to or greater than about 3 V (e.g., a voltage level of 10 V). According to an exemplary embodiment of the present invention the turn-off voltage may have a voltage level of 20 V.

A first gate insulating layer 20b may be disposed on the substrate 10 and may cover the gate electrode 35b. The first gate insulating layer 20b may insulate the gate electrode 35b from the auxiliary gate electrode 25b. The first gate insulating layer 20b may include a single layer or multiple layers including an inorganic material including silicon oxide (SiOx) and/or silicon nitride (SiNx).

The auxiliary gate electrode 25b may be disposed on the first gate insulating layer 20b and may overlap a portion of the gate electrode 35b. The first voltage Va may be applied to the auxiliary gate electrode 25b. When the thin-film transistor TFT is a p-type thin-film transistor, the first voltage Va applied to the auxiliary gate electrode 25b may have a negative direct current voltage level. For example, the first voltage Va may have a voltage level of from about −6 V to about 0 V. For example, the first voltage Va may be −3.5 V. The auxiliary gate electrode 25b may include a relatively low resistance metal material. For example, the auxiliary gate electrode 25b may include a single layer or multiple layers including a conductive material including molybdenum (Mo), aluminum (Al), copper (Cu), or titanium (Ti).

A second gate insulating layer 30b may be disposed on the first gate insulating layer 20b and may cover the auxiliary gate electrode 25b. The second gate insulating layer 30b may insulate the auxiliary gate electrode 25b from the active layer 15b. The second gate insulating layer 30b may include a single layer or multiple layers including an inorganic material including silicon oxide (SiOx) and/or silicon nitride (SiNx). The second gate insulating layer 30b may include a same material as the first gate insulating layer 20b.

The active layer 15b may be disposed on the second gate insulating layer 30b and may partly overlap the gate electrode 35b. The active layer 15b may include the source region SR, the drain region DR, and the channel region CR between the source region SR and the drain region DR. A voltage of the source region SR may be referred to as the source voltage Vs, and a voltage of the drain region DR may be referred to as the drain voltage Vd.

The channel region CR may overlap the gate electrode 35b. The channel region CR may include the first portion CR1 overlapping with the auxiliary gate electrode 25b, and the second portion CR2 not overlapping with the auxiliary gate electrode 25b. The first portion CR1 may overlap with the auxiliary gate electrode 25b and may thus be affected by an electric field due to the first voltage Va applied to the auxiliary gate electrode 25b. The first portion CR1 may be adjacent to the drain region DR, and the second portion CR2 may be adjacent to the source region SR. An area of the channel region CR may be determined by multiplying a channel length between the source region SR and the drain region DR by a channel width in a perpendicular direction with respect to the channel length. The first portion CR1 and the second portion CR2 may have substantially identical channel widths. The auxiliary gate electrode 25b may be disposed below the first portion CR1 of the channel region CR, which may be adjacent to the drain region DR. In an exemplary embodiment of the present invention, the auxiliary gate electrode 25b may be disposed below the first portion CR1 and may also be disposed below a portion of the drain region DR which is adjacent to the first portion CR1. That is, the auxiliary gate electrode 25b may extend toward the drain region DR.

The active layer 15b may include a semiconductor material such as amorphous silicon or polycrystalline silicon. However, exemplary embodiments of the present invention are not limited thereto, and the active layer 15b may include an oxide semiconductor material such as GIZO[$(In_2O_3)_a$ $(Ga_2O_3)_b(ZnO)_c$] (where, a, b, c are real numbers that satisfy a≥0, b≥0, c>0, respectively). The active layer 15b may include, in addition to GIZO, oxide of at least one material of Groups 12, 13, and 14 elements including zinc (Zn), indium (In), gallium (Ga), tin (Sn), cadmium (Cd), germanium (Ge), and hafnium (Hf), and a combination thereof.

When the active layer 15b includes amorphous silicon or polycrystalline silicon, the source region SR and the drain region DR may be doped with an impurity. For example, when the thin-film transistor TFT is a p-type thin-film transistor, the source region SR and the drain region DR may include a p-type impurity such as boron, or aluminum. When the thin-film transistor TFT is an n-type thin-film transistor, the source region SR and the drain region DR may include an n-type impurity such as phosphorus, or arsenic. According to another exemplary embodiment of the present invention, when the active layer 15b includes an oxide semiconductor material, a process in which the source region SR and the drain region DR are doped with the impurity may be omitted. Throughout the specification, the thin-film transistor TFT may be a p-type thin-film transistor. However, exemplary embodiments of the present invention are not limited thereto.

An area of the first portion CR1 may be from about 10% to about 50% of the area of the channel region CR. For example, the area of the first portion CR1 may be from about 20% to about 40% of the area of the channel region CR. When a channel length of the channel region CR is 2.75 μm, the drain voltage Vd may be −5.1 V, and a voltage of −3.5 V may be applied to the auxiliary gate electrode 25b. Even if the gate voltage Vg exceeds 10 V, if lengths of the first portion CR1 are 0.4 μm, 0.6 μm, and 0.8 μm, a leakage current might not be increased.

An interlayer insulating layer 40b may be disposed on the second gate insulating layer 30b and may cover the active layer 15b. The interlayer insulating layer 40b may include a single layer or multiple layers including an inorganic material. For example, the inorganic material may include a metal oxide material or a metal nitride material. The inorganic material may include silicon nitride ($SiO_2$), silicon nitride (SiNx), silicon oxynitride (SiON), aluminum oxide ($Al_2O_3$), titanium oxide ($TiO_2$), tantalum pentoxide ($Ta_2O_5$), hafnium oxide ($HfO_2$), or zirconium oxide ($ZrO_2$). Source and drain electrodes may be disposed on the interlayer insulating layer 40b.

In an exemplary embodiment of the present invention, the auxiliary gate electrode 25b may be disposed below the first portion CR1 of the channel region CR in the bottom-gate type thin-film transistor. To turn off a thin-film transistor, when a high-level gate voltage Vg of about at least 10 V is applied to the gate electrode 35b, electrons may gather on a bottom surface of the channel region CR. When the drain voltage Vd has a low level of about −5 V, the electrons that gather on the bottom surface of the channel region CR may move toward the source region SR due to a large electric field induced by the drain voltage Vd, and thus a leakage current may be generated.

However, according to an exemplary embodiment of the present invention, the first voltage Va having a negative voltage level may be applied to the auxiliary gate electrode 25b disposed below the first portion CR1. Thus, a negative electric field may be applied to a bottom surface of the first portion CR1, and a strong electric field might not be induced in the bottom surface of the first portion CR1. Thus, electrons gathered due to the gate voltage Vg on a bottom surface of the second portion CR2 might not move toward the source region SR. Thus, even if the gate voltage Vg is further increased or the drain voltage Vd is further decreased, a leakage current might not be generated.

Figure 4:
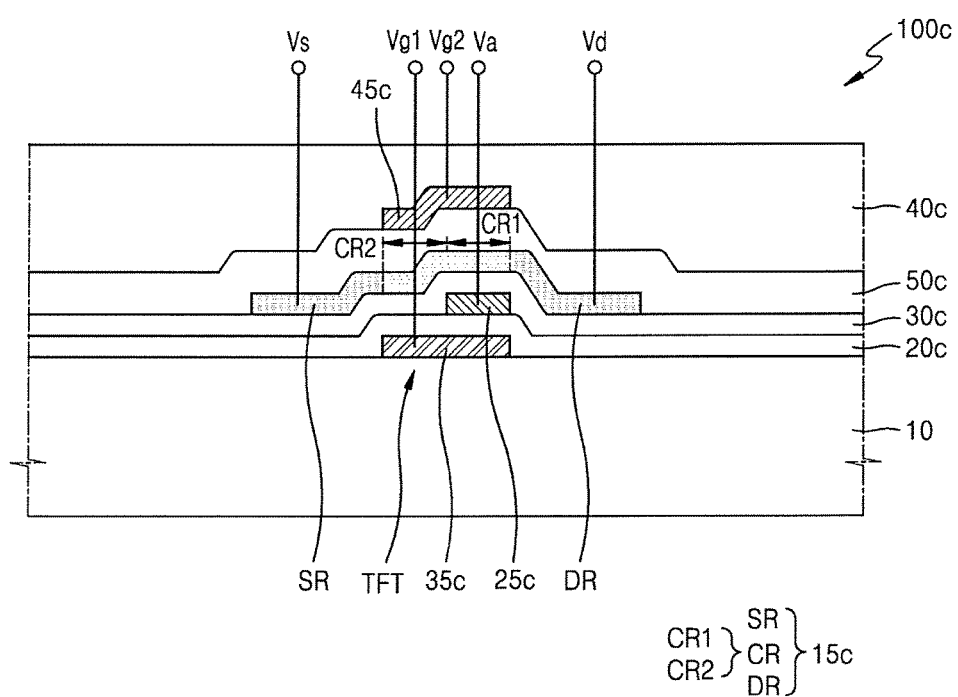
FIG. 4 illustrates a cross-sectional view of a thin-film transistor substrate, according to an exemplary embodiment of the present invention.

FIG. 4 illustrates a cross-sectional view of a thin-film transistor substrate, according to an exemplary embodiment of the present invention.

Referring to FIG. 4, a thin-film transistor substrate 100c may include the substrate 10, a first gate electrode 35c, an auxiliary gate electrode 25c, an active layer 15c, and a second gate electrode 45c. The first gate electrode 35c, the auxiliary gate electrode 25c, the active layer 15c, and the second gate electrode 45c may form a double-gate type thin-film transistor.

The first gate electrode 35c, the auxiliary gate electrode 25c, and the active layer 15c may be substantially the same as the gate electrode 35b, the auxiliary gate electrode 25b, and the active layer 15b of the thin-film transistor substrate 100b, and duplicative descriptions may be omitted. First and second gate insulating layers 20c and 30c, and an interlayer insulating layer 40c may be substantially the same as the first and second gate insulating layers 20b and 30b, and the interlayer insulating layer 40b, and duplicative descriptions may be omitted.

The thin-film transistor substrate 100c may include a third gate insulating layer 50c and the second gate electrode 45c between the active layer 15c and the interlayer insulating layer 40c.

The third gate insulating layer 50c may be disposed between the active layer 15c and the second gate electrode 45c. The third gate insulating layer 50c may include a single layer or multiple layers including an inorganic material including silicon oxide (SiOx) and/or silicon nitride (SiNx). The third gate insulating layer 50c may include a same material as the first and second gate insulating layers 20c and 30c.

The second gate electrode 45c may be disposed on the third gate insulating layer 50c and may overlap the channel region CR of the active layer 15c. The second gate electrode 45c may include a relatively low resistance metal material. For example, the second gate electrode 45c may include a single layer or multiple layers including a conductive material including molybdenum (Mo), aluminum (Al), copper (Cu), or titanium (Ti). A second gate voltage Vg2 that applies an ON or OFF signal to the thin-film transistor may be applied to the second gate electrode 45c. A first gate voltage Vg1 may be applied to the first gate electrode 35c.

When the first gate voltage Vg1 has a high voltage level and the drain voltage Vd has a negative voltage level, the auxiliary gate electrode 25c may apply a negative electric field to the first portion CR1. The negative electric field may prevent electrons gathered on a bottom surface of the second portion CR2 of the channel region CR from flowing toward the source region SR due to a strong electric field. Thus, a leakage current may be reduced or eliminated. The auxiliary gate electrode 25c may be referred to as the first auxiliary gate electrode 25c.

A second auxiliary gate electrode may be disposed between the active layer 15c and the second gate electrode 45c. The second auxiliary gate electrode may overlap the first portion CR1 of the channel region CR. When the second gate voltage Vg2 has a high voltage level and the drain voltage Vd has a negative voltage level, the second auxiliary gate electrode may apply a negative electric field to the first portion CR1. The negative electric field may prevent electrons gathered on a top surface of the second portion CR2 of the channel region CR from flowing toward the source region SR due to a strong electric field. Thus, a leakage current may be reduced or eliminated.

A thin-film transistor according to an exemplary embodiment of the present invention might not include the first auxiliary gate electrode 25c and may include the second auxiliary gate electrode described below with reference to FIG. 5.

Figure 5:
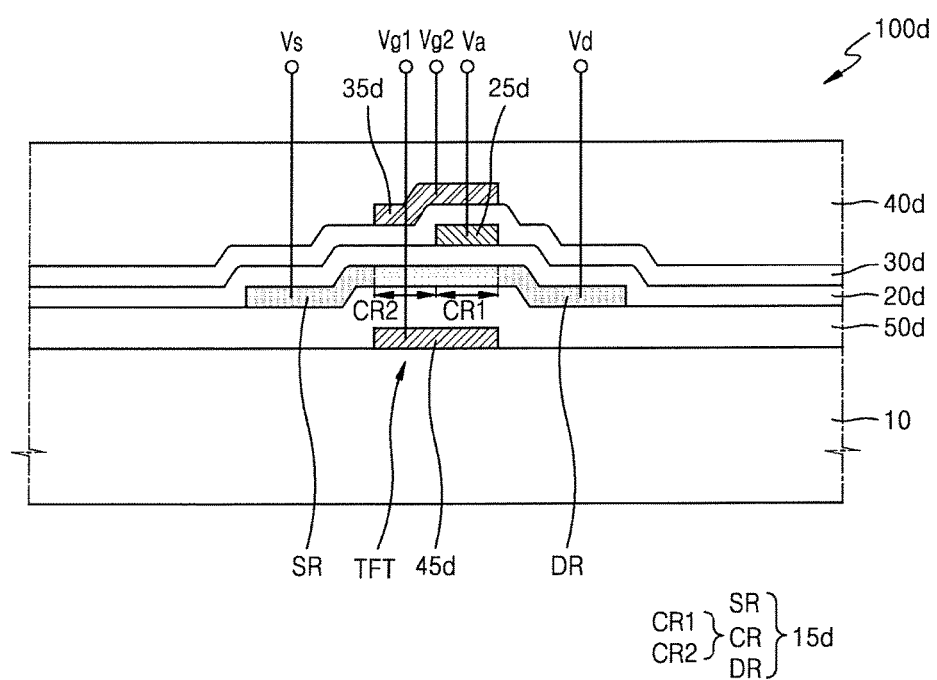
FIG. 5 illustrates a cross-sectional view of a thin-film transistor substrate, according to an exemplary embodiment of the present invention.

FIG. 5 illustrates a cross-sectional view of a thin-film transistor substrate, according to an exemplary embodiment of the present invention.

Referring to FIG. 5, a thin-film transistor substrate 100d may include the substrate 10, a first gate electrode 45d, an active layer 15d, an auxiliary gate electrode 25d, and a second gate electrode 35d. The first gate electrode 45d, the active layer 15d, the auxiliary gate electrode 25d, and the second gate electrode 35d may form a double-gate type thin-film transistor.

The active layer 15d, the auxiliary gate electrode 25d, and the second gate electrode 35d may be substantially the same as the active layer 15, the auxiliary gate electrode 25, and the gate electrode 35 of the thin-film transistor substrate 100, and duplicative descriptions may be omitted. First and second gate insulating layers 20d and 30d, and an interlayer insulating layer 40d may be substantially the same as the first and second gate insulating layers 20 and 30, and the interlayer insulating layer 40, and duplicative descriptions may be omitted.

The thin-film transistor substrate 100d may include the first gate electrode 45d and a third gate insulating layer 50d between the substrate 10 and the active layer 15d.

The third gate insulating layer 50d may be disposed below the first gate insulating layer 20d between the substrate 10 and the active layer 15d. The third gate insulating layer 50d may include a single layer or multiple layers including an inorganic material including silicon oxide (SiOx) and/or silicon nitride (SiNx). The third gate insulating layer 50d may include a same material as the first and second gate insulating layers 20d and 30d.

The first gate electrode 45d may be disposed below the third gate insulating layer 50d and may overlap a channel region CR of the active layer 15d. The first gate electrode 45d may include a relatively low resistance metal material. For example, the first gate electrode 45d may include a single layer or multiple layers including a conductive material including molybdenum (Mo), aluminum (Al), copper (Cu), or titanium (Ti). The first gate voltage Vg1 that applies an ON or OFF signal to the thin-film transistor may be applied to the first gate electrode 45d. The second gate voltage Vg2 may be applied to the second gate electrode 35d.

When the second gate voltage Vg2 has a high voltage level and the drain voltage Vd has a negative voltage level, the auxiliary gate electrode 25d may apply a negative electric field to a first portion CR1. The negative electric field may prevent electrons gathered on a top surface of a second portion CR2 of the channel region CR from flowing toward a source region SR due to a strong electric field. Thus, a leakage current may be reduced or eliminated. The auxiliary gate electrode 25d may be referred to as the second auxiliary gate electrode 25d.

A first auxiliary gate electrode may be disposed between the first gate electrode 45d and the active layer 15d. The first auxiliary gate electrode may overlap the first portion CR1 of the channel region CR. When the first gate voltage Vg1 has a high voltage level and the drain voltage Vd has a negative voltage level, the first auxiliary gate electrode may apply a negative electric field to the first portion CR1. The negative electric field may prevent electrons gathered on a bottom surface of the second portion CR2 of the channel region CR from flowing toward the source region SR due to a strong electric field. Thus, a leakage current may be reduced or eliminated.

Figure 6:
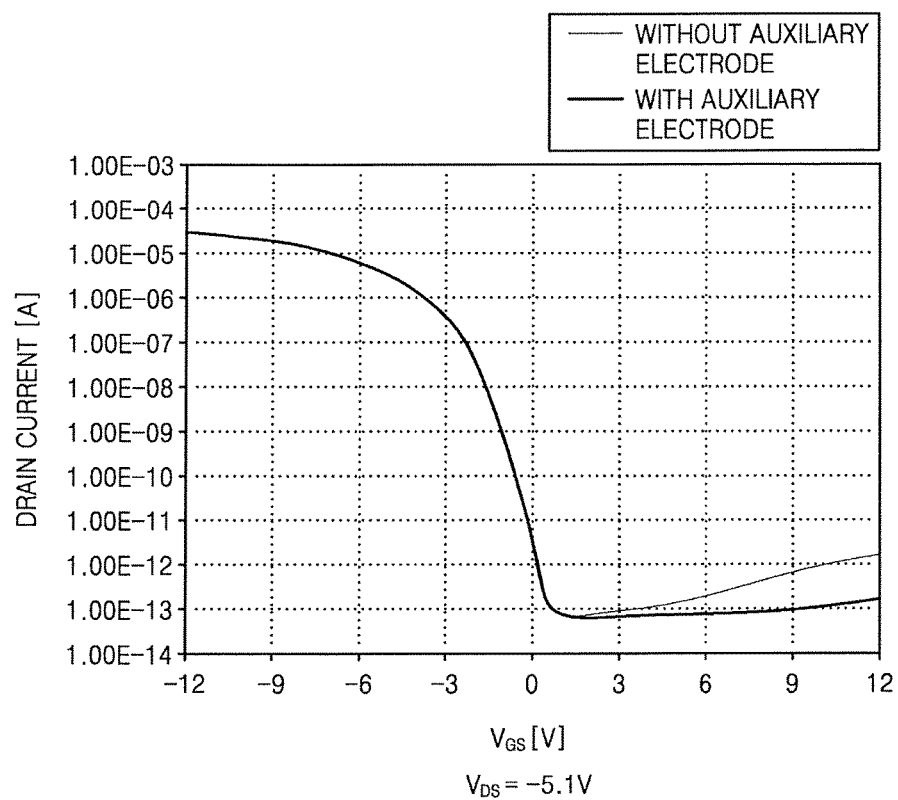
FIG. 6 illustrates graphs showing voltage-current characteristics of a thin-film transistor according to a comparative example and a thin-film transistor according to an exemplary embodiment of the present invention.

FIG. 6 illustrates graphs showing voltage-current characteristics of a thin-film transistor according to a comparative example and a thin-film transistor according to an exemplary embodiment of the present invention.

FIG. 6 illustrates a drain current with respect to a gate-source voltage Vgs of a thin-film transistor according to an exemplary embodiment of the present invention. The graphs illustrated in FIG. 6 show the drain current for p-type thin-film transistors. However, exemplary embodiments of the present invention are not limited thereto.

In the p-type thin-film transistors, the more the gate-source voltage Vgs is decreased, the more the drain current may be increased. When the gate-source voltage Vgs is about at least 0.5 V, the drain current may be decreased below 10 A through 13 A, and the thin-film transistor may be turned off.

When the gate-source voltage Vgs exceeded 0.5 V in the thin-film transistor according to the comparative example which does not include an auxiliary gate electrode, the drain current may gradually increase. When the gate-source voltage Vgs is increased up to 10 V, the drain current may be increased above 10V through 12V.

In the thin-film transistor including the auxiliary gate electrode according to an exemplary embodiment of the present invention, even if the gate-source voltage Vgs is increased to exceed 0.5 V, the drain current may remain substantially unchanged. Even if the gate-source voltage Vgs was increased up to 10 V, the drain current may be maintained at a low level of about 10V through 13 V. Thus, when the gate-source voltage Vgs is 10 V, a leakage current was reduced to about $1/10$ of a leakage current according to the comparative example. In the thin-film transistor including the auxiliary gate electrode according to an exemplary embodiment of the present invention, the first voltage Va applied to the auxiliary gate electrode may be −3.5 V.

Figure 7A:
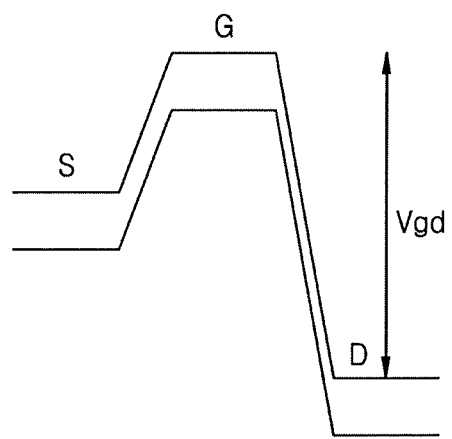
FIGS. 7A and 7B illustrate electrical potential graphs with respect to the thin-film transistor according to a comparative example and the thin-film transistor according to an exemplary embodiment of the present invention.
Figure 7B:
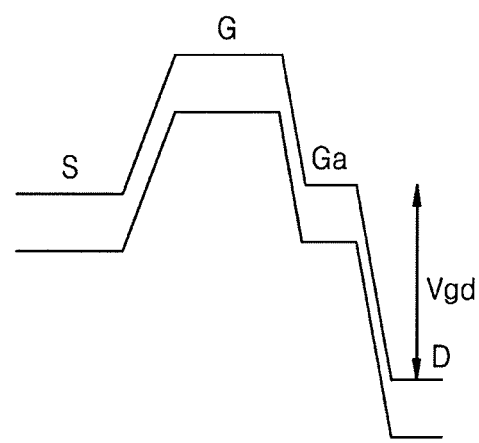

FIGS. 7A and 7B illustrate electrical potential graphs with respect to a thin-film transistor according to a comparative example and a thin-film transistor according to an exemplary embodiment of the present invention.

Referring to FIG. 7A, the electrical potential graph illustrates a p-type thin-film transistor excluding an auxiliary gate electrode that is turned off. Referring to FIG. 7B, the electrical potential graph illustrates a p-type thin-film transistor including the auxiliary gate electrode according to an exemplary embodiment of the present invention that is turned off. Referring to FIGS. 7A and 7B, a horizontal axis displays a source region S, a gate electrode G, and a drain region D, and a vertical axis displays electrical potentials Vgd of the source region S, the gate electrode G, and the drain region D. The electrical potential of the source region is 0 V in FIGS. 7A and 7B.

Referring to FIGS. 7A and 7B, the thin-film transistor may be turned off by an electrical potential of a gate electrode that is higher than the electrical potential of the source region S. When an electrical potential of the drain region D is lower than the electrical potential of the source region S, as illustrated in FIG. 7A, for example, a gate-drain voltage of the thin-film transistor according to a comparative example may be high. Thus, electrons may be gathered in the channel region due to a high-level voltage applied to the gate electrode G, and the gathered electrons may flow toward the drain region D having the low-level electrical potential.

However, in the thin-film transistor according to an exemplary embodiment of the present invention, the first voltage Va having a negative voltage level may be applied to the auxiliary gate electrode Ga, and thus a gate-drain voltage that affects an off leakage current may be decreased, as shown in FIG. 7B, for example. Thus, as illustrated in FIG. 6, for example, the leakage current may be substantially decreased.

Figure 8:
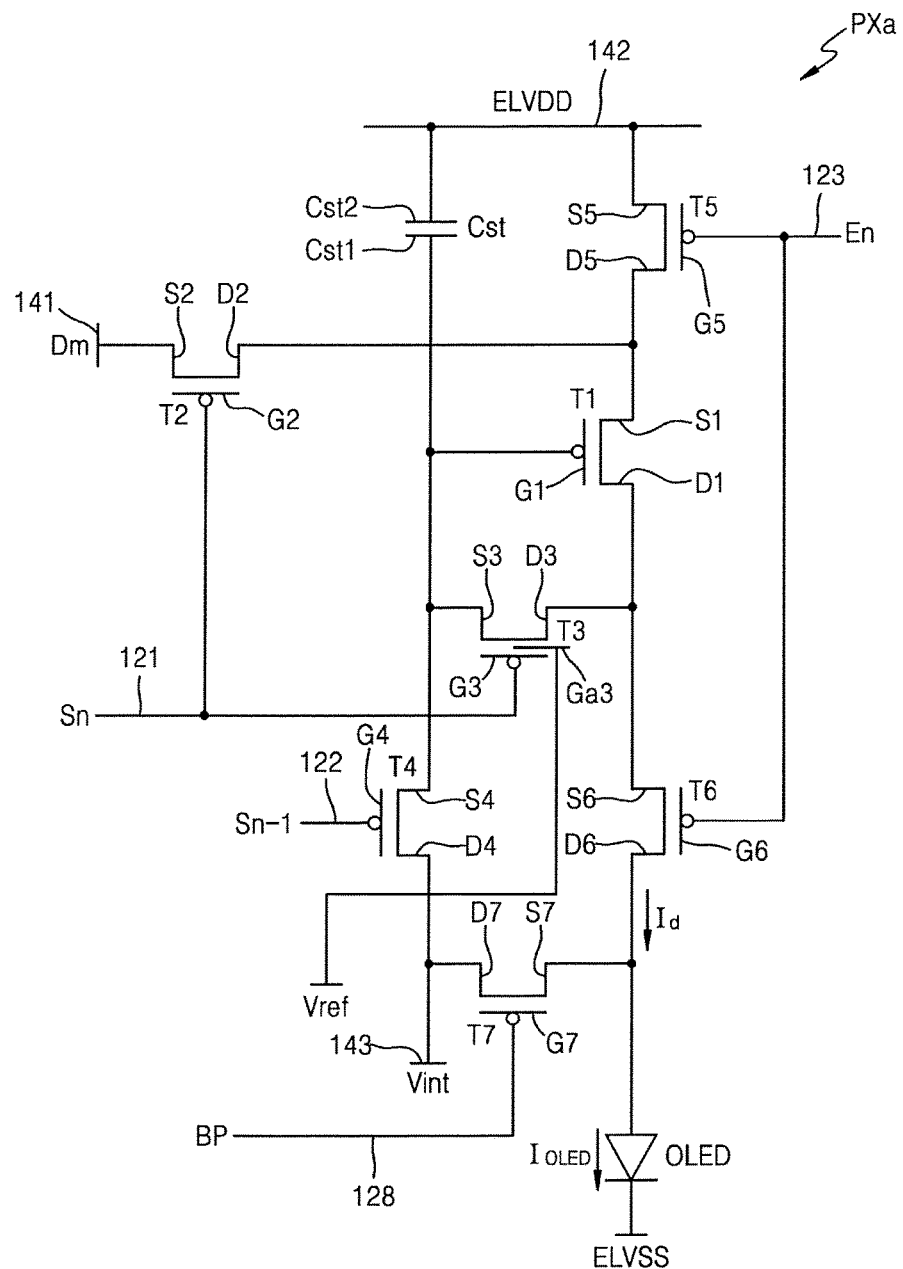
FIG. 8 illustrates an equivalent circuit diagram illustrating a pixel of an organic light-emitting display apparatus including a thin-film transistor according to an exemplary embodiment of the present invention.

FIG. 8 illustrates an equivalent circuit diagram illustrating a pixel of an organic light-emitting display apparatus including a thin-film transistor according to an exemplary embodiment of the present invention.

Referring to FIG. 8, a pixel PXa may include a plurality of thin-film transistors. For example, the pixel PXa may include a driving thin-film transistor T1, a switching thin-film transistor T2, a compensation thin-film transistor T3, an initialization thin-film transistor T4, an operation control thin-film transistor T5, an emission control thin-film transistor T6, and a bypass thin-film transistor T7, a storage capacitor Cst, and an organic light-emitting diode OLED which may be connected to a plurality of signal lines 121, 122, 123, 128, 141, 142, and 143. A reference voltage Vref may be applied to the pixel PXa.

The pixel PXa may include the driving thin-film transistor T1, the switching thin-film transistor T2, the compensation thin-film transistor T3, the initialization thin-film transistor T4, the operation control thin-film transistor T5, the emission control thin-film transistor T6, and the bypass thin-film transistor T7. However, exemplary embodiments of the present invention are not limited thereto, and the pixel PXa may include only some thin-film transistors among the thin-film transistors T1, T2, T3, T4, T5, T6, and T7. For example, the pixel PXa may include only the driving thin-film transistor T1, the switching thin-film transistor T2, and the compensation thin-film transistor T3, or the pixel PXa may further include at least one of the initialization thin-film transistor T4, the operation control thin-film transistor T5, the emission control thin-film transistor T6, and the bypass thin-film transistor T7, in addition to the driving thin-film transistor T1, the switching thin-film transistor T2, and the compensation thin-film transistor T3.

The compensation thin-film transistor T3 of the pixel PXa may have a structure of one of the thin-film transistors described above with reference to FIGS. 1 through 5 according to an exemplary embodiment of the present invention. That is, the compensation thin-film transistor T3 may include an auxiliary gate Ga3. The reference voltage Vref may be applied to the auxiliary gate Ga3. The reference voltage Vref may be a negative voltage, and for example, the reference voltage Vref may have a voltage level of from about −6 V to about 0 V. For example, the reference voltage Vref may be substantially equal to an initialization voltage Vint.

The signal lines 121, 122, 123, 128, 141, 142, and 143 may be respectively referred to as the scan line 121, which may deliver a scan signal Sn to the switching thin-film transistor T2 and the compensation thin-film transistor T3; the previous scan line 122, which may deliver a previous scan signal Sn−1 to the initialization thin-film transistor T4; the emission control line 123, which may deliver an emission control signal En to the operation control thin-film transistor T5 and the emission control thin-film transistor T6; the bypass control line 128, which may deliver a bypass signal BP to the bypass thin-film transistor T7; the data line 141, which may cross the scan line 121 and may deliver a data signal voltage Dm; the driving voltage line 142, which may deliver a first driving voltage ELVDD and may be substantially parallel with the data line 141; and the initialization voltage line 143, which may deliver the initialization voltage Vint for initializing the driving thin-film transistor T1.

A gate G1 of the driving thin-film transistor T1 may be connected to a first electrode Cst1 of the storage capacitor Cst. A source S1 of the driving thin-film transistor T1 may be connected to the driving voltage line 142 via the operation control thin-film transistor T5. A drain D1 of the driving thin-film transistor T1 may be electrically connected to an anode of the organic light-emitting diode OLED via the emission control thin-film transistor T6. The driving thin-film transistor T1 may receive the data signal voltage Dm in response to a switching operation of the switching thin-film transistor T2 and may store the data signal voltage Dm in the storage capacitor Cst. The driving thin-film transistor T1 may generate a driving current Id corresponding to the voltage stored in the storage capacitor Cst and may output the driving current Id to the organic light-emitting diode OLED.

A gate G2 of the switching thin-film transistor T2 may be connected to the scan line 121. A source S2 of the switching thin-film transistor T2 may be connected to the data line 141. A drain D2 of the switching thin-film transistor T2 may be connected to the source S1 of the driving thin-film transistor T1. The switching thin-film transistor T2 may be turned on by the scan signal Sn received via the scan line 121 and may perform the switching operation for delivering the data signal voltage Dm, which may be received via the data line 141, to the source S1 of the driving thin-film transistor T1.

A gate G3 of the compensation thin-film transistor T3 may be connected to the scan line 121. A source S3 of the compensation thin-film transistor T3 may be commonly connected to the first electrode Cst1 of the storage capacitor Cst, a drain D4 of the initialization thin-film transistor T4, and the gate G1 of the driving thin-film transistor T1. A drain D3 of the compensation thin-film transistor T3 may be connected to the drain D1 of the driving thin-film transistor T1. The compensation thin-film transistor T3 may be turned on according to the scan signal Sn received via the scan line 121 and thus may connect the gate G1 and the drain D1 of the driving thin-film transistor T1, so that the compensation thin-film transistor T3 diode-connects the driving thin-film transistor T1. When the switching thin-film transistor T2 delivers the data signal voltage Dm to the source S1 of the driving thin-film transistor T1, the compensation thin-film transistor T3 may diode-connect the driving thin-film transistor T1 so that a data voltage that is compensated from a threshold voltage of the driving thin-film transistor T1 is stored in the storage capacitor Cst.

The compensation thin-film transistor T3 may include the auxiliary gate Ga3 to which the reference voltage Vref may be applied. The auxiliary gate Ga3 may be disposed between an active layer and the gate G3. The auxiliary gate Ga3 may include an auxiliary gate electrode that overlaps a portion of a channel region of the compensation thin-film transistor T3. When the compensation thin-film transistor T3 is turned off, the auxiliary gate Ga3 may apply a negative electric field to a portion of the channel region (e.g., the first portion CR1) which may be adjacent to the drain D3, and thus the auxiliary gate Ga3 may reduce or eliminate a leakage current.

The source S3 of the compensation thin-film transistor T3 may be connected to the storage capacitor Cst. When the leakage current is generated in the compensation thin-film transistor T3, charges stored in the storage capacitor Cst may be discharged via the compensation thin-film transistor T3. Since the driving thin-film transistor T1 generates the driving current Id according to a voltage stored in the storage capacitor Cst, when the first electrode Cst1 of the storage capacitor Cst is decreased, amplitude of the driving current Id of the driving thin-film transistor T1 may be increased. For example, when a black color is supposed to be displayed, the driving thin-film transistor T1 may generate a small driving current Id due to the leakage current, and thus the organic light-emitting diode OLED may emit a relatively small amount of light.

However, the compensation thin-film transistor T3 may include the auxiliary gate Ga3 to which the reference voltage Vref is applied, and thus when the compensation thin-film transistor T3 is turned off, the leakage current may be significantly decreased, and the charges stored in the storage capacitor Cst might not be discharged via the compensation thin-film transistor T3. Thus, colors may be more accurately displayed.

A gate G4 of the initialization thin-film transistor T4 may be connected to the previous scan line 122. A source S4 of the initialization thin-film transistor T4 may be commonly connected to the first electrode Cst1 of the storage capacitor Cst, the source S3 of the compensation thin-film transistor T3, and the gate G1 of the driving thin-film transistor T1. The drain D4 of the initialization thin-film transistor T4 may be connected to the initialization voltage line 143. The initialization thin-film transistor T4 may perform an initialization operation by being turned on according to the previous scan signal Sn−1 received via the previous scan line 122, delivering the initialization voltage Vint to the gate G1 of the driving thin-film transistor T1, and initializing a voltage of the gate G1 of the driving thin-film transistor T1. The previous scan signal Sn−1 may also be referred to as an initialization control signal.

A gate G5 of the operation control thin-film transistor T5 may be connected to the emission control line 123. A source S5 of the operation control thin-film transistor T5 may be connected to the driving voltage line 142. A drain D5 of the operation control thin-film transistor T5 may be connected to the source S1 of the driving thin-film transistor T1 and the drain D2 of the switching thin-film transistor T2.

A gate G6 of the emission control thin-film transistor T6 may be connected to the emission control line 123. A source S6 of the emission control thin-film transistor T6 may be connected to the drain D1 of the driving thin-film transistor T1 and the drain D3 of the compensation thin-film transistor T3. A drain D6 of the emission control thin-film transistor T6 may be electrically connected to an anode of the organic light-emitting diode OLED. The operation control thin-film transistor T5 and the emission control thin-film transistor T6 may be substantially simultaneously turned on according to the emission control signal En received via the emission control line 123, and thus the first driving voltage ELVDD may be provided to the organic light-emitting diode OLED, and an emission current $I_{OLED}$ may flow through the organic light-emitting diode OLED.

A gate G7 of the bypass thin-film transistor T7 may be connected to the bypass control line 128. A source S7 of the bypass thin-film transistor T7 may be commonly connected to the drain D6 of the emission control thin-film transistor T6 and the anode of the organic light-emitting diode OLED. A drain D7 of the bypass thin-film transistor T7 may be commonly connected to the initialization voltage line 143 and the source S4 of the initialization thin-film transistor T4.

A second electrode Cst2 of the storage capacitor Cst may be connected to the driving voltage line 142. A cathode of the organic light-emitting diode OLED may be connected to a second driving voltage ELVSS. Thus, the organic light-emitting diode OLED may emit light by receiving the emission current $I_{OLED}$ from the driving thin-film transistor T1, and thus the organic light-emitting diode OLED may display an image.

An operation of the pixel PXa of the organic light-emitting display apparatus according an exemplary embodiment of the present invention will be described in more detail below.

During an initialization period, the previous scan signal Sn−1 having a low voltage level may be supplied via the previous scan line 122. The initialization thin-film transistor T4 may be turned on in response to the previous scan signal Sn−1. The initialization voltage Vint may be applied from the initialization voltage line 143 to the gate G1 of the driving thin-film transistor T1 via the initialization thin-film transistor T4, and the driving thin-film transistor T1 may be initialized by the initialization voltage Vint.

During a data programming period, the scan signal Sn having a low voltage level may be supplied via the scan line 121. The switching thin-film transistor T2 and the compensation thin-film transistor T3 may be turned on in response to the scan signal Sn. The driving thin-film transistor T1 may be diode-connected by the compensation thin-film transistor T3, and may be biased in a forward direction. A compensation voltage Dm+Vth (e.g., where, Vth has a negative value) which is decreased by a threshold voltage Vth of the driving thin-film transistor T1 from the data signal voltage Dm, which is supplied via the data line 141, may be applied to a gate electrode of the driving thin-film transistor T1.

The first driving voltage ELVDD and the compensation voltage Dm+Vth may be applied to both terminals of the storage capacitor Cst, and charges corresponding to a difference between voltages of both terminals (e.g., ELVDD−Dm−Vth) may be stored in the storage capacitor Cst. When the emission control signal En supplied from the emission control line 123 is changed from a high level to a low level, the operation control thin-film transistor T5 and the emission control thin-film transistor T6 may be turned on due to the emission control signal En.

The driving current Id according to a voltage difference between a voltage of the gate G1 of the driving thin-film transistor T1 and the first driving voltage ELVDD may be generated, and may be supplied to the organic light-emitting diode OLED via the emission control thin-film transistor T6. During the emission period, a source-gate voltage Vsg of the driving thin-film transistor T1 may be maintained as 'ELVDD−(Dm+Vth)' due to the storage capacitor Cst. According to a current-voltage of the driving thin-film transistor T1, the driving current Id may be in proportion to a square (e.g., (ELVDD−Dm)$^2$) of a value obtained by subtracting the threshold voltage Vth from the source-gate voltage Vsg. Thus, the driving current Id may be generated, regardless of the threshold voltage Vth of the driving thin-film transistor T1.

The bypass thin-film transistor T7 may receive the bypass signal BP from the bypass control line 128. The bypass thin-film transistor T7 may be turned on in response to the bypass signal BP. The initialization voltage Vint may be applied to the anode of the organic light-emitting diode OLED. During a non-emission period, charges remaining on the anode of the organic light-emitting diode OLED may be discharged via the bypass thin-film transistor T7. Thus, when the driving current Id corresponding to a black image is transmitted, the organic light-emitting diode OLED may display an accurate black luminance image and a contrast ratio may be increased.

Figure 9:
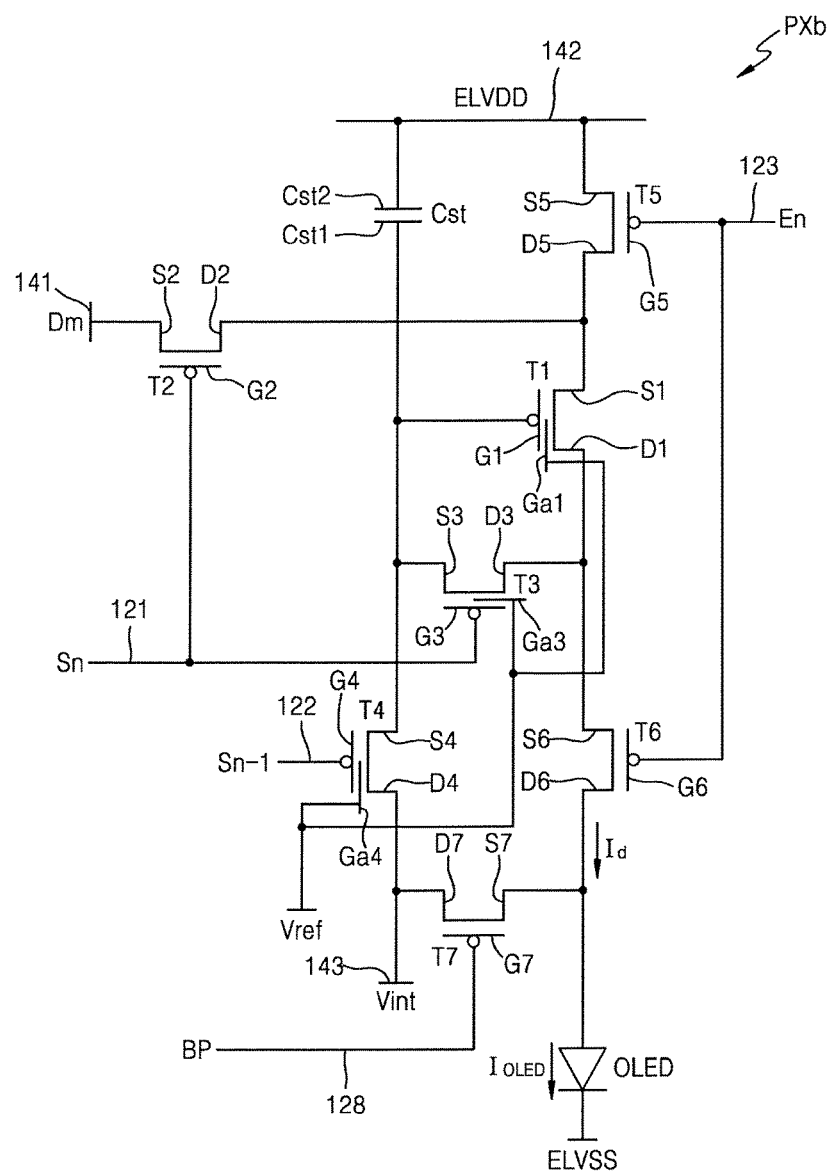
FIG. 9 illustrates an equivalent circuit diagram illustrating a pixel of an organic light-emitting display apparatus including a thin-film transistor according to an exemplary embodiment of the present invention.

FIG. 9 illustrates an equivalent circuit diagram illustrating a pixel of an organic light-emitting display apparatus including a thin-film transistor according to an exemplary embodiment of the present invention.

Referring to FIG. 9, a pixel PXb may include the plurality of thin-film transistors T1, T2, T3, T4, T5, T6, and T7, the storage capacitor Cst, and the organic light-emitting diode OLED. The pixel PXb may be substantially the same as the pixel PXa, except that, in the pixel PXb, the driving thin-film transistor T1 and the initialization thin-film transistor T4 may include auxiliary gates Ga1 and Ga4, respectively. The reference voltage Vref may be applied to the auxiliary gates Ga1 and Ga4. Thus, duplicative descriptions may be omitted.

The initialization thin-film transistor T4 of the pixel PXb may have a structure of one of the thin-film transistors described with reference to FIGS. 1 through 5 according to an exemplary embodiment of the present invention. The initialization thin-film transistor T4 may include the auxiliary gate Ga4. The reference voltage Vref may be applied to the auxiliary gate Ga4. The reference voltage Vref may be a negative voltage. For example, the reference voltage Vref may have a voltage level of from about −6 V to about 0 V. For example, the reference voltage Vref may be equal to an initialization voltage Vint. The driving thin-film transistor T1 of the pixel PXb may have a structure of one of the thin-film transistors described with reference to FIGS. 1 through 5 according to an exemplary embodiment of the present invention. The driving thin-film transistor T1 may include the auxiliary gate Ga1. The reference voltage Vref may be applied to the auxiliary gate Ga1. However, exemplary embodiments of the present invention are not limited to the pixel PXb of FIG. 9, and at least some thin-film transistors among the thin-film transistors T1, T2, T3, T4, T5, T6, and T7 may have a structure of one of the thin-film transistors described above with reference to FIGS. 1 through 5. For example, an auxiliary gate electrode might only be included in the thin-film transistor T1 in the pixel PXb according to an exemplary embodiment of the present invention. In an exemplary embodiment of the present invention, all of the thin-film transistors T1, T2, T3, T4, T5, T6, and T7 may have auxiliary gate electrodes according to the thin-film transistors described above with reference to FIGS. 1 through 5.

The initialization thin-film transistor T4 may include the auxiliary gate Ga4 to which the reference voltage Vref may be applied. The auxiliary gate Ga4 may be disposed between an active layer and a gate G3. The auxiliary gate Ga4 may include an auxiliary gate electrode that overlaps a portion of a channel region of the initialization thin-film transistor T4. When the initialization thin-film transistor T4 is turned off, the auxiliary gate Ga4 may apply a negative electric field to a portion of the channel region (e.g., the first portion CR1) which may be adjacent to the drain D4, and thus the auxiliary gate Ga4 may reduce or eliminate a leakage current.

The source S4 of the initialization thin-film transistor T4 may be connected to the first electrode Cst1 of the storage capacitor Cst. When the leakage current is generated in the initialization thin-film transistor T4, a voltage of the first electrode Cst1 may be decreased due to the leakage current emitted via the initialization thin-film transistor T4. Since the driving thin-film transistor T1 may generate the driving current Id according to a voltage stored in the storage capacitor Cst, when a voltage of the first electrode Cst1 of the storage capacitor Cst is decreased, amplitude of the driving current Id of the driving thin-film transistor T1 may be increased. For example, when a black color is supposed to be displayed, the driving thin-film transistor T1 may generate a small driving current Id due to the leakage current, and thus the organic light-emitting diode OLED may emit a relatively small amount of light.

However, in the initialization thin-film transistor T4 including the auxiliary gate Ga4 to which the reference voltage Vref is applied, when the initialization thin-film transistor T4 is turned off, the leakage current may be substantially decreased, and thus the charges stored in the storage capacitor Cst might not be discharged via the initialization thin-film transistor T4. Thus, colors may be displayed more accurately.

The driving thin-film transistor T1 may include the auxiliary gate Ga1 to which the reference voltage Vref is applied. The auxiliary gate Ga1 may be disposed between an active layer and the gate G1. The auxiliary gate Ga1 may include an auxiliary gate electrode that overlaps a portion of a channel region CR of the driving thin-film transistor T1. When the driving thin-film transistor T1 is turned off, the auxiliary gate Ga1 may apply a negative electric field to a portion of the channel region CR which may be adjacent to the drain D1, and thus may prevent a strong electric field from being generated between the channel region CR and a drain region DR.

The gate G1 of the driving thin-film transistor T1 may be connected to the first electrode Cst1 of the storage capacitor Cst. A voltage of the gate G1 may be substantially increased, thus displaying a black color. Thus, a strong electric field may be induced between the channel region CR and the drain region DR of the driving thin-film transistor T1. If the strong electric field is induced in a boundary between the channel region CR and the drain region DR, a lifetime of the driving thin-film transistor T1 may be decreased. However, in the driving thin-film transistor T1 including the auxiliary gate Ga1 to which the reference voltage Vref is applied, the auxiliary gate Ga1 may apply the negative electric field to the portion of the channel region CR, which is adjacent to the drain region DR. Thus, it may be possible to prevent the strong electric field from being induced in the boundary between the channel region CR and the drain region DR. Thus, deterioration of the driving thin-film transistor T1 may be reduced or eliminated, and the driving thin-film transistor T1 may have a relatively longer lifespan.

Figure 10:
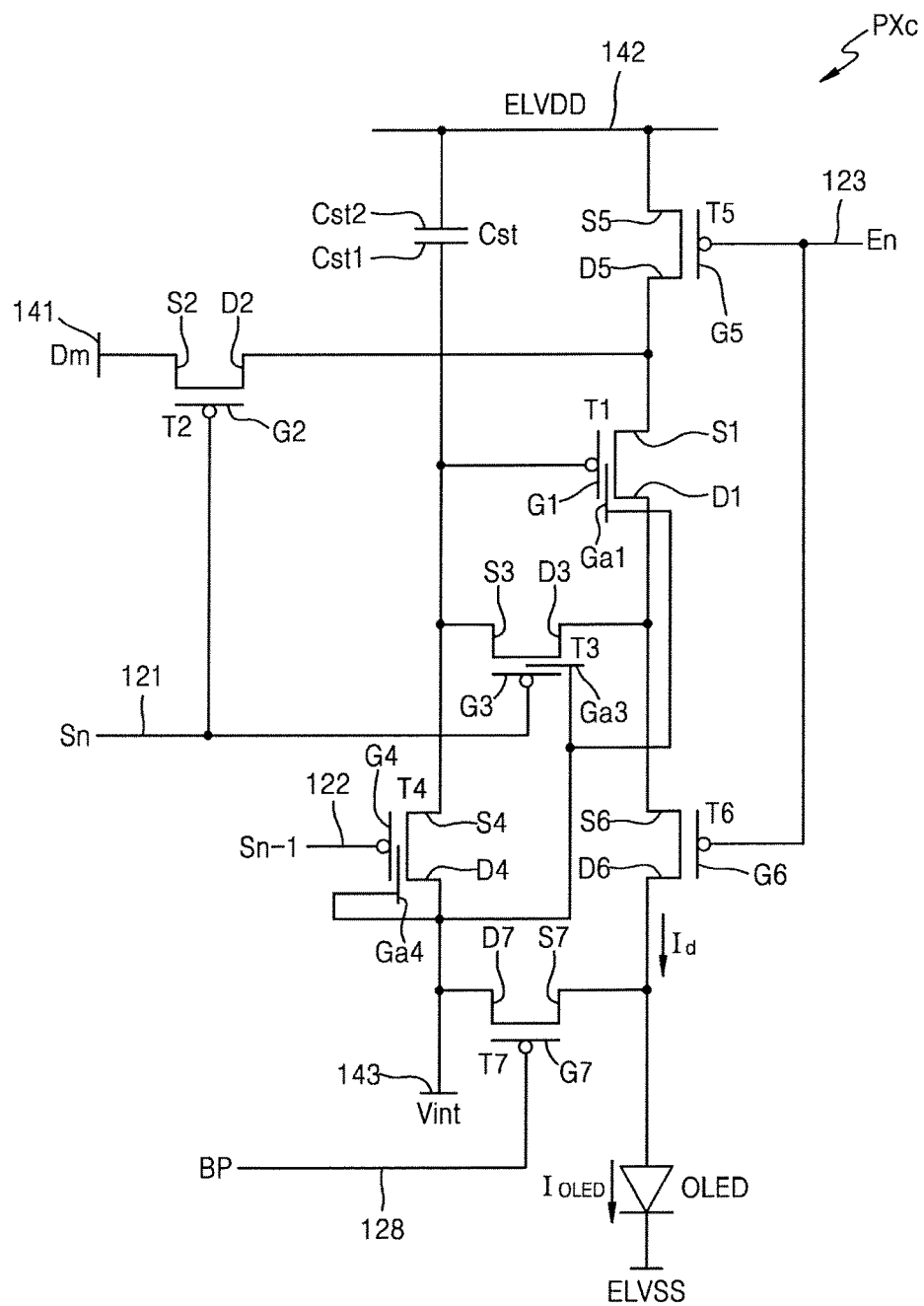
FIG. 10 illustrates an equivalent circuit diagram illustrating a pixel of an organic light-emitting display apparatus including a thin-film transistor according to an exemplary embodiment of the present invention.

FIG. 10 illustrates an equivalent circuit diagram illustrating a pixel of an organic light-emitting display apparatus including a thin-film transistor according to an exemplary embodiment of the present invention.

Referring to FIG. 10, a pixel PXc may include the plurality of thin-film transistors T1, T2, T3, T4, T5, T6, and T7, the storage capacitor Cst, and the organic light-emitting diode OLED. The pixel PXc may be substantially the same as the pixel PXb, except that, in the pixel PXc, the reference voltage Vref might not be applied to auxiliary gates Ga1, Ga3, and Ga4 and the initialization voltage Vint may be applied to the auxiliary gates Ga1, Ga3, and Ga4. Thus, duplicative descriptions may be omitted.

The reference voltage Vref having the negative voltage level may be applied to the pixels PXa and PXb. In the pixel PXc according to an exemplary embodiment of the present invention, the initialization voltage Vint may be applied to the auxiliary gates Ga1, Ga3, and Ga4. The initialization voltage Vint may be applied to the gate G1 of the driving thin-film transistor T1 via the initialization thin-film transistor T4 in response to the previous scan signal Sn−1. The initialization voltage may be applied to an anode of the organic light-emitting diode OLED via the bypass thin-film transistor T7 in response to the bypass signal BP. The initialization voltage Vint may have a negative voltage level. For example, the initialization voltage Vint may have a voltage level of about −6 V to about 0 V. For example, the initialization voltage Vint may be −3.5 V.

According to an exemplary embodiment of the present invention, the initialization voltage Vint may be used without an additional reference voltage Vref, and thus a structure of the pixel PXc may be simplified.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. An organic light-emitting display apparatus comprising:
    a substrate;
    an active layer disposed on the substrate, wherein the active layer comprises a source region, a drain region, and a channel region disposed between the source region and the drain region;
    a gate electrode overlapping the channel region, wherein a gate voltage is applied to the gate electrode;
    an auxiliary gate electrode disposed between the gate electrode and the channel region, and to which a first voltage is applied; and
    a first thin-film transistor comprising the active layer, the auxiliary gate electrode, and the gate electrode, wherein the first thin-film transistor is turned on or off according to the gate voltage, and the gate voltage is different from the first voltage.

2. The organic light-emitting display apparatus of claim 1, wherein the channel region comprises a first portion overlapping the auxiliary gate electrode, and a second portion not overlapping the auxiliary gate electrode, and
    wherein the first portion is adjacent to the drain region, and the second portion is adjacent to the source region.

3. The organic light-emitting display apparatus of claim 2, wherein an area of the first portion is from −10% to 50% of an area of the channel region.

4. The organic light-emitting display apparatus of claim 1, wherein the first thin-film transistor comprises a p-type transistor, and the first voltage has a negative direct current voltage level.

5. The organic light-emitting display apparatus of claim 4, wherein the first voltage has a voltage level from about −6 V to about 0 V.

6. The organic light-emitting display apparatus of claim 1, further comprising:
    a first gate insulating layer disposed between the active layer and the auxiliary gate electrode, wherein the first gate insulating layer insulates the active layer from the auxiliary gate electrode; and
    a second gate insulating layer disposed between the auxiliary gate electrode and the gate electrode, wherein the second gate insulating layer insulates the auxiliary gate electrode from the gate electrode.

7. The organic light-emitting display apparatus of claim 1, wherein the gate electrode is disposed on the active layer.

8. The organic light-emitting display apparatus of claim 1, wherein the gate electrode is disposed between the substrate and the active layer.

9. The organic light-emitting display apparatus of claim 1, wherein the gate electrode comprises a first gate electrode disposed on the active layer overlapping the channel region, and a second gate electrode disposed between the substrate and the active layer overlapping the channel region.

10. The organic light-emitting display apparatus of claim 9, wherein the auxiliary gate electrode is disposed between one of the first and second gate electrodes and the channel region.

11. The organic light-emitting display apparatus of claim 9, wherein the auxiliary gate electrode comprises a first auxiliary gate electrode disposed between the first gate electrode and the channel region, and a second auxiliary gate electrode disposed between the second gate electrode and the channel region.

* * * * *